United States Patent [19]

Hack

[11] Patent Number: 5,101,409
[45] Date of Patent: Mar. 31, 1992

[54] CHECKBOARD MEMORY SELF-TEST

[75] Inventor: George E. Hack, Pleasanton, Calif.

[73] Assignee: International Business Machines Corporation, Armonk, N.Y.

[21] Appl. No.: 418,297

[22] Filed: Oct. 6, 1989

[51] Int. Cl.⁵ .......................................... G11C 29/00
[52] U.S. Cl. ................................. 371/21.3; 371/21.2
[58] Field of Search ................... 371/21.3, 22.3, 21.2, 371/27; 364/717

[56] References Cited

U.S. PATENT DOCUMENTS

| | | | |
|---|---|---|---|
| 3,758,759 | 9/1973 | Boisvert, Jr. et al. | 371/21.1 |
| 3,761,695 | 4/1973 | Eickelberger | 235/153 AC |
| 3,783,254 | 1/1974 | Eichelberger et al. | 235/152 |
| 4,282,584 | 8/1981 | Brown et al. | 371/51.1 |
| 4,300,234 | 11/1981 | Marugama et al. | 371/27 |
| 4,502,131 | 2/1985 | Giebel | 365/201 |
| 4,513,418 | 4/1985 | Bardell, Jr. et al. | 371/25 |
| 4,519,078 | 5/1985 | Komonytsky | 371/25 |
| 4,597,080 | 6/1986 | Thatte et al. | 371/25 |
| 4,601,034 | 7/1986 | Sridhar | 371/25 |
| 4,654,849 | 3/1987 | White et al. | 371/21 |
| 4,701,919 | 10/1987 | Naitoh et al. | 371/27 |
| 4,754,215 | 6/1988 | Kawai | 371/27 |
| 4,775,977 | 10/1988 | Dehara | 371/27 |
| 4,782,487 | 11/1988 | Smelser | 371/27 |
| 4,788,684 | 11/1988 | Kawaguchi et al. | 371/27 |
| 4,903,266 | 2/1990 | Hack | 364/717 |

OTHER PUBLICATIONS

McCluskey, E. J., "Built-In Self-Test Techniques," *IEEE Design and Test*, Apr. 1985, pp. 21-28.

Wang L. and E. J. McClusky "Feedback Shift Registor for Self-Testing Circuits", *USLI Systems Design*, Dec. 1986, pp. 50-58.

E. J. McCluskey and S. Bozongin Neshat, "Design for Autonomous Test," *IEEE Transactions on Computers*, vol. C-30, No. 11, Nov. 1981, pp. 866-875.

P. H. Bardell & W. H. McAnney, "Pseudorandium Arrays for Built-In Tests", *IEEE Transactions on Computers*, vol. C-35, No. 7, Jul. 1986, pp. 653-658.

TU9-87-012 "Memory Self-Test", Patent Application, G. E. Hack, No. 187, 708 Dated Filed 4/29/88.

IBM Technical Disclosure Bulletin, C. F. Mejwera, Jr. "Pattern Generator for Memory Test System", (vol. 26, No. 3A, Aug. 1983), p. 1078.

IBM Technical Disclosure Bulletin, vol. 21, No. 12, May, 1979, S. D. Kelly, "Imbedded Memory Test Methods", pp. 4911-4922.

Primary Examiner—Jerry Smith
Assistant Examiner—Phung My Chung
Attorney, Agent, or Firm—Manny W. Schecter

[57] ABSTRACT

The invention is a system and method for high-efficiency checkerboard memory self-test. A random pattern generator configuration includes a linear feedback shift register and a multiple input signature register. The random pattern generator is used to step through the memory addresses in generating the checkerboard pattern. The two least significant address lines connecting the random pattern generator and the memory array are connected together via an exclusive OR gate. Because these address lines indicate the parity of the current and next memory addresses to be generated in the random pattern generator, the output of the exclusive OR gate indicates whether the next memory address to be generated is of the same or different type of state compared to the current memory address. The output of the exclusive OR gate can thus be connected to the data input shift register of the memory array to permit conditional shifting of the checkerboard data pattern into the memory array. One logic state is input to the current memory address when the output of the exclusive OR gate is a logical one and the other logical state is input to the current memory address when the output of the exclusive OR gate is a logical zero.

9 Claims, 1 Drawing Sheet

FIG. 1

CHECKBOARD MEMORY SELF-TEST

BACKGROUND OF THE INVENTION

1. Field of the Invention

This invention relates to a system and method for high-efficiency checkerboard memory self-test. More particularly, the invention is an on-chip system and method for performing checkerboard self-test of memory circuits.

2. Description of the Related Art

Numerous methods have been proposed for the testing of integrated circuitry. Typically, a black box technique is used. In this technique, a circuit is provided with a deterministic stimulus, thereby generating a response from the circuit, which is compared to a known expected output. Based on the comparisons, the circuit is determined to be simply good or bad. Past problems with the testing of integrated circuitry are the large test data volumes and long test times.

Self-test refers to the presence of testing circuits which are on a component containing the circuits to be tested. The component may be a card, wafer, or an integrated circuit chip. Thus, self-test may be accomplished with testing circuits integrated into the circuits to be tested (i.e., on-chip), or located externally on the component (i.e., off-chip). The choice between on-chip and off-chip testing requires balancing two competing factors. Off-chip testing is advantageous because the testing circuits need not be reproduced with the production of each integrated circuit chip. On-chip testing is considered advantageous because of its closeness to the circuits being tested, thereby making testing available at significantly higher speeds than for off-chip testing and requiring little more than an external power supply therefor. In recent years, the balance has swung in favor of on-chip testing because the increase in integrated circuit density available has reduced the emphasis on chip real estate and increased the emphasis on testing speed.

On-chip circuit testing can be divided into areas of logic circuit testing and memory circuit testing. For both types of on-chip testing it is desirable to be able to test all storage points in both the logical zero and one states. Due to recent increases in on-chip circuit density, it is becoming more likely that integrated circuit chips will contain both logic and memory circuits. Thus, there is an increasing need to be able to test both logic circuits and memory circuits on the same chip. However, most known circuit testing techniques are directed merely to the testing of logic circuits.

The problem presented by the testing of logic circuits is the accessibility and observability of the logic circuit storage elements (latches). These storage elements are typically intertwined in such a manner that data cannot be inputted into a particular logic circuit storage element independently of other storage elements. Control of the independent logic circuit storage elements is required for logic circuit testing so that a known stimulus can be provided to the logic circuits, and the results can be observed. This problem has been solved by level sensitive scan design (LSSD) techniques. ISSD techniques are widely known, as described, for example, in U.S. Pat. Nos. 3,761,695 or 3,783,254.

LSSD testing is implemented by imparting a shift register capability to each of the logic system latches and by making these shift register latches (SRL's) accessible during an input/output mode. LSSD testing requires operation of the logic circuits in two separate modes. In the first mode, known test data is serially inputted and shifted to the appropriate SRL locations. With the SRL initialized to a known state, operation of the logic circuits in the second mode begins. Known test data is thus propagated through the logic circuits to act as a stimuli to the system, the results being captured in the SRL's. Upon reversion to the original mode of operation, the status of the SRL's can be outputted and compared with known data which would be present if the circuitry operated correctly.

LSSD logic circuit testing is convenient because it permits sequential logic to be tested as combinatorial logic. In recent years, however, such "deterministic" circuit testing has become increasingly expensive. Circuit density has increased so rapidly that it is no longer feasible to provide for input/output (i.e., accessibility and observability) at each logical storage element. The same problem makes this technique impractical for memory test as well. Thus, more efficient techniques are required for the testing of circuits.

Another known technique for circuit testing is signature analysis. Known test data patterns are again used to stimulate logic or memory circuits. Data outputted from the stimulated circuits are then fed into a logic circuit which compresses the data into a data signature. The data signature is then compared to the data signature which would result had the logic or memory circuits functioned properly. Examples of such signature analysis can be seen in U.S. Pat. Nos. 4,597,080 and 4,601,034.

The advantage of signature analysis over simple deterministic testing is the compression of the outputted test data. The storing of test data for each output response is no longer required, thereby reducing tester complexity and test data volume. Although this feature also prevents the ability to easily determine the precise location of a circuit failure, such is irrelevant because the high circuit density and low cost of integrated circuit chips has made it impractical to repair a detected failure. Instead, a failed chip is discarded and another substituted in its place.

Despite the aforementioned advantages, signature analysis is not a sufficiently efficient technique for testing the circuit densities achievable today. Large amounts of circuits are still required to initialize highly dense logic and memory circuits. Recent techniques for testing logic circuits are disclosed in U.S. Pat. Nos. 4,513,418 and 4,519,078. These techniques employ a random pattern generator, including a linear feedback shift register, provided with known seed data (not all zeros) to apply a set of data patterns to test LSSD logic circuits. A random pattern generator cycle is herein defined as the period of time beginning with seeding and ending when the seed data reappears in the shift register. The efficient generation of memory addresses requiring initialization is a particular problem heretofore not resolved by these techniques. A random pattern generator simply having the same number of stages as there are address lines required for memory addressing will not cycle through all memory addresses. For example, the exclusive OR gate(s) in the feedback loop inevitably receive and therefore return a logical one to the initial stage of the shift register, thereby preventing the generation of the memory address consisting of all zeros. This is good in the sense that the presence of all zeros in the shift register would cause the random pattern generator to repeat the all zero state because the exclusive OR gate feedback loop would never generate anything but additional zeros. However, the all zero address must still be generated for complete testing. Thus, a simple system and method for generating the memory address consisting of all zeros is required.

The inability of linear feedback shift registers to generate patterns including the all zero state has been recognized. One publication merely recommends modification of the shift register without further specification. McCluskey, E. J., "Built-In Self-Test Techniques," *IEEE Design and Test,* April, 1985, pp. 21-28. Another publication suggests modification of the existing stages or feedback loop of the shift register to generate the all zero state. Wang, L. and McCluskey, E. J., "Feedback Shift Registers For Self-Testing Circuits," *VLSI Systems Design,* Dec., 1986, pp. 50-58 and McCluskey, E. J. and Bozorgui-Nesbat, S., "Design for Autonomous Test," *IEEE Transactions on Computers,* Vol. c-30, No. 11, November, 1981, pp. 866-875. However, the proposed modifications render the shift register non-linear or the feedback loop more complex than a simple exclusive OR gate. Thus, these publications do not solve the aforementioned problems.

Regarding logic testing only, the addition of a stage to a linear feedback shift register has been proposed to allow for an all zero output window. Bardell, P. H. and McAnney, W. H., "Pseudorandom Arrays for Built-In Tests," *IEEE Transactions on Computers,* Vol. c-35, No. 7, July, 1986, pp. 653-58. The output window is an array of data, the rows of which are formed from the data present in some of the stages of the shift register at various times during the data pattern. However, the array is generated inefficiently, using only a small portion of the existing stages of the shift register. This is because the proposal is directed to the generation of the all zero state in the entire array, not the generation of an all zero state in the shift register. The number of stage in the shift register do not correspond to the number of lines needed for addressing, and are reduced only by a complex logic circuit for inputting data from the shift register into the array. Furthermore, the complexity of the logic circuit makes it difficult to adapt to a particular memory size.

The simple generation of all memory addresses for on-chip self-test of memory is addressed in co-pending U.S. Pat. application Ser. No. 187,708, Memory Self-Test, Hack, hereby incorporated by reference. A random pattern generator configuration includes a linear feedback shift register containing at least one more stage than address lines needed for addressing the memory. The data from the additional random pattern generator stages are not used in so far as memory addressing is concerned. The random pattern generator design is based upon a primitive polynomial. Such a random pattern generator ensures that cycling through all possible combinations of the test data patterns accounts for each memory address in the memory circuits, including the address of all zeros. The all-zero address is accounted for when the random pattern generator generates all zeros, except for a logical one in at least one of the additional stages of the shift register. Exhaustive coverage of the memory addresses may also be accomplished by using non-linear configurations or reversible deBruijn counters.

The generation of each possible memory address makes it possible to determine if each memory location is capable of achieving both memory states. This is known as "functional" testing. Despite functional testing, a need still exists to verify that there is no interaction between physically adjacent memory cells. For example, the ability of a particular memory cell to achieve a particular memory state could be dependent on the memory state of one or more of its neighboring memory cells.

It is known to use checkerboard memory tests to verify that there is no interaction between adjacent memory cells. Examples of such checkerboard memory tests are disclosed in U.S. Pat. Nos. 4,502,131; 4,654,849; IBM TECHNICAL DISCLOSURE BULLETIN, Vol. 26, No. 3A, August 1983, pps. 1078-1079; and IBM TECHNICAL, DISCLOSURE BULLETIN, Vol. 21, No. 12, May 1979, pps. 4911-4913. Typically, an alternating zero and one pattern is written into the memory array and read back out followed by the writing of the complimentary pattern and its reading. Because a checkerboard memory test would normally be performed in conjunction with a functional memory cell test verifying that the controls and address circuitry are operating correctly, it is desirable that both tests be able to utilize some or all of the same circuitry. The use of common circuitry would improve the efficiency of testing and minimize the physical space required for the circuits for both tests.

SUMMARY OF THE INVENTION

In view of the foregoing, it is the principle object of this invention to improve systems and methods for checkerboard memory self-test.

Another object of this invention is a system and method for on-chip checkerboard memory self-test.

Still another object of this invention is a system and method for on-chip checkerboard memory self-test utilizing circuitry common to that required for on-chip functional memory self-test and on-chip functional logic self-test.

Still another object of this invention is a system and method for efficiently generating checkerboard patterns for memory self-test.

These and other objects of this invention are accomplished using a random pattern generator (RPG) configuration including a linear feedback shift register and a multiple input signature register (MISR). The random pattern generator is used to step through the memory addresses in generating the checkerboard pattern. The two least significant address lines connecting the random pattern generator and the memory array are also connected together via an exclusive OR gate. Because these address lines indicate the parity of the current and next memory addresses to be generated in the random pattern qenerator, the output of the exclusive OR gate indicates whether the next memory address to be generated is of the same or different type of state compared to the current memory address. The output of the exclusive OR gate can thus be connected to the data input shift register of the memory array to permit conditional shifting of the checkerboard data pattern into the memory array. One logic state is input to the current memory address when the output of the exclusive OR gate is a logical one and the other logical state is input to the current memory address when the output of the exclusive OR gate is a logical zero.

In operation, the random pattern generator and multiple input signature register are first used to functionally test both memory and logic. After such functional testing, the checkerboard pattern is written to the memory array during an RPG cycle and read out of memory into the multiple input signature register during the following such cycle. In the subsequent two RPG cycles the complement checkerboard pattern is written to memory and read out to the multiple input signature register. The generation of the complementary data is accomplished by circuitry connected between the exclusive OR gate and the data input shift register to the memory array. At the completion of each or all RPG cycles, the signature generated by the MISR is then compared to that known for a good memory array.

The foregoing and other objects, features, and advantages of the invention will be apparent from the following more particular description of the preferred embodiment of the invention, as illustrated in the accompanying drawing.

DESCRIPTION OF THE PREFERRED EMBODIMENT

Figure 1:
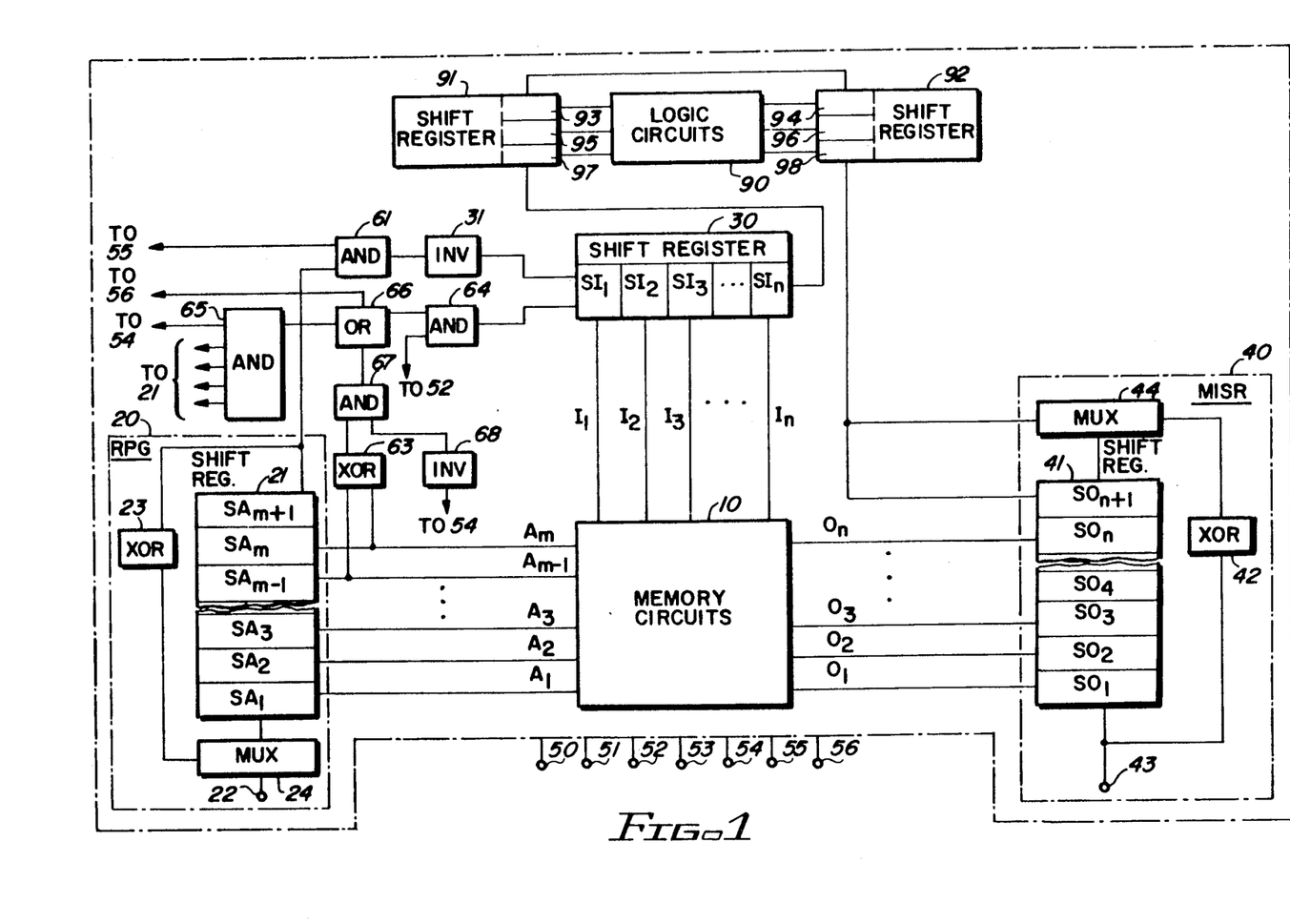
FIG. 1 is a schematic system diagram of the preferred embodiment of the invention.

Referring to FIG. 1, the system for self-test of memory circuits 10 and logic circuits 90 including checkerboard self-test of memory, will now be described. Memory circuits 10 include an array of data words each containing "n" bits. Data is written into memory 10 via input lines $I_1, I_2, I_3 \ldots I_n$ and read out from memory 10 via output lines $O_1, O_2, O_3 \ldots$ On Memory addressing during read/write operations is accomplished via "m" address lines $A_1, A_2, A_3 \ldots A_m$. Memory 10 can therefore contain up to $2^m$ word lines and up to $(2m \times n)$ memory cells. The testing circuits can thus be adapted for any size memory, the exact values of m and n being significant only as stated herein.

Address data for memory 10 are generated by RPG 20. Seed data can be entered into stages $5A_1-5A_{m+1}$ of shift register 21 of RPG 20 via input node 22. Data exiting different stages of shift register 21 are inputted into exclusive OR gate 23, the output of which is rerouted as input data back into shift register 21 via multiplexer 24. RPG 20 is thus capable of cycling through a set of pseudo-random data patterns. By pseudo-random it is meant that the data patterns are random only in so far as the selection of the seed data and the configuration of the feedback path of the RPG. Provided the same seed data are always used, the test patterns are repeatable.

The design of RPG 20 is based upon a "primitive polynomial." The stages of shift register 21 which are used to generate feedback to form the next state can be described by a polynomial. For a shift register with z stages, the feedback will be described be a zth degree polynomial. The remainder of the polynomial describes the feedback loop of the RPG. Feedback from the last stage of the shift register would be a "1" ($x^0$), feedback from the next to last stage of the shift register would be an "x" ($x^1$), and so on. For example, a four stage shift register having feedback from the last two stages would be described by the polynomial "$x^4+x+1$". If the zth degree characteristic polynomial p(x) is irreducible (i.e. cannot be factored) and if:

$$\frac{x^y - 1}{p(x)} = 0 \bmod p(x) \quad \text{for } y = 2^z - 1$$
$$= \text{anything but } 0 \bmod p(x) \quad \text{for } y < 2^z - 1$$

then p(x) is a primitive polynomial. At least one primitive polynomial of degree z exists for every possible value of z. Examples of primitive polynomials are available in table form in various references. See, Peterson, W. W., and Weldon, E. J., *Error Correcting Codes*, 2nd Ed., 1972. Sample primitive polynomials are $x^4+x^3+1$, $x^5+x^2+1$, $x^{18}+x^7+1$, $x^{21}+x^2+1$, and $x^{31}+x^3+1$. Thus, the actual configuration of RPG 20 may vary according to the size of shift register 21.

A random pattern generator based on a primitive polynomial and having z stages will generate ($2^z-1$) states if permitted to cycle through all possible data states. All data states are generated except for the all zero state. The all zero state cannot be generated because feedback from a data "1" in the shift register must inevitably regenerate another data "1". Thus only ($2^z-1$) states can actually be generated Note that shift register 21 contains at least one stage in addition to the number of address lines m (i.e., a total of at least (m+1) stages, or z>m). Because of this feature, the all zero address of memory 10 can be generated. Although all of the stages of shift register 21 cannot be in the zero state simultaneously, as mentioned, the stages connected to the address lines will at some point during cycling all be in the zero state while at least one of the remaining stages (those not connected to the address lines) is in the "1" state.

Data exiting the last stage of shift register 21 are also routed through AND gate 61 and switchable inverter 31 to shift register 30. Shift register 30 has n stages, $SI_1-SI_n$, connected to n input lines, permitting the input of words composed of n bits into memory 10. Data exiting the last stage of shift register 30 are routed through shift register 91, including stages 93, 95 and 47. From shift register 91, data will propagate through logic circuits 90 to shift register 92, including stages 94, 96 and 98. Shift registers 91 and 92 are designed according to LSSD criteria such as shown in U.S. Pat. Nos. 3,761,695 and 3,783,254, hereby incorporated by reference.

Data from shift register 92 and memory 10 are routed to MISR 40 Shift register 41 has at least (n+1) stages, $50_1-50_{n+1}$, connected to n output lines, permitting the output of words composed of n bits to MISR 40 from memory 10, and output from shift register 92. Data exiting different stages of shift register 41 of MISR 40 are inputted into exclusive OR gate 42, the output of which is rerouted as input data back into shift register 41 via multiplexer 44. Data may be outputted from shift register 41 via output node 43. RPG 20, input shift register 30, and MISR 40 are designed according to LSSD criteria, except so far as the aforementioned number of stages of shift register 21, so as to permit initialization. The stages of shift registers 21, 30, and 41 are shown by the boxes therein in FIG. 1, as connected to the address, input, and output lines respectively.

Clocks 50–53 control the operation of the entire system. System clocks 50 and 51 control operations involving memory 10 and logic 90 respectively. These clocks and read/write select switch 54 determine whether data will be written into or read out of memory circuits 10 and whether results will be captured from logic circuits 90. Shift clocks 52 and 53 control the shifting of data through shift registers 21, 30, 41, 91, and 92 and operate RPG 20 and MISR 40 in test mode. Mode select 55, Scan or Test, configures the system for scanning data into the shift registers or operating in test mode to test logic 90 or memory 10. Mode select 56 configures the system for functional memory test or checkerboard memory test. As shown, the entire system of FIG. 1 may be integrated into the workings of a microchip to permit on-chip self-test.

The circuitry for generating the checkerboard memory pattern is connected between RPG 20 and shift register 30. Such circuitry includes an exclusive OR gate 63, the inputs of which are connected to the two least significant address lines of shift register 21. The state of the least significant address line $A_m$ indicates whether the address of the memory cell currently being addressed is even or odd. The address of such memory cell is hereinafter referred to as the "current address". The input line to exclusive OR gate 63 which is connected to the next least significant address line $A_{m-1}$ indicates whether the address of the memory cell to be addressed immediately after the addressing of the current address is even or odd. Such address is hereinafter referred to as the "next address". The current address and the next address are not necessarily physically related or in some prescribed proximity to each other in memory array 10. The exact locations in memory array 10 of the current address and next address is determined by RPG 20 and the seed data.

The output of exclusive OR gate 63 represents a comparison of the odd or even type of binary states of the current address and next address. Such a comparison is hereinafter referred to as "parity". Whenever such states are identical, the output of exclusive OR gate 63 will be a zero. Whenever such states are opposite in nature, the output of exclusive OR gate 63 will be a one. Such output is connected as an input to AND gate 67, then to OR gate 66, AND gate 64, and to shift register 30. The first stage of shift register 30 is a standard flip-flop which will alternately change state with each cycle of shift clock 52, if permitted by AND gate 64.

AND gate 67 includes an input line in addition to the output from exclusive OR gate 63. The addition input lines is the output of inverter 68 which is in turn controlled by read/write select switch 54, thereby allowing signals to pass through AND gate 67 only while memory array 10 is being written. The output of AND gate 67 is input to OR gate 66. The other inputs to OR gate 66 are the output of AND gate 65 and mode select 56. The inputs to AND gate 65 include read/write select switch 54 and the various stages of shift register 21. The connection to read/write select switch 54 makes the output of AND gate 65 determinant upon whether the system is currently reading data from memory circuits 10 or writing data into memory circuits 10. The connections to shift register 21 are for the memory address zero. The connection is such that AND gate 65 can only output a particular logical state when the binary address zero is the current address The zero address will appear only once during the read cycle and will complement the data in shift register 30 in preparation for the next write cycle. For convenience, such connection is not shown in FIG. 1, but would be known to one of skill in the art.

METHOD OF OPERATION

Referring to FIG. 1, the method of self-testing memory circuits 10 and logic circuits 90 including checkerboard self-testing of memory, will now be described. In the system mode of operation (i.e. no testing), the system is responsive to system clocks 50 and 51 only. To test the system, seed data must be entered into RPG 20, shift registers 30, 91, 92 and MISR 40. Seeding is performed by setting mode select 55 to scan mode and switching system control over to shift blocks 52 and 53 and activating input node 22 to permit data to be scanned through the system. In this way, known data is present in RPG 20, shift register 30, 91, 92 and MISR 40 at the beginning of testing.

Test mode begins once seeding is complete, using both system clocks 50 and 51, shift clocks 52 and 53, and mode select 55 to control the operation of the system. Read/write select switch 54 is used to determine whether data are being written into or read out of memory 10. Test mode includes at least four cycles of RPG 20. A RPG cycle comprises the shifting of data through shift register 21, exclusive OR gate 23, and back into shift register 21 until all possible combinations of binary data have passed through the stages of shift register 21. Multiplexer 24 controls node 22 to permit seeding (scan mode) or data feedback (test mode). Since shift register 21 has $(m+1)$ stages, the number of possible data combinations which must pass through shift register 21 is $2(m+1)-1$.

To functionally test memory circuits 10, each memory cell in the memory array must be initialized. This is accomplished using RPG 20 and shift register 30. The data present in shift register 30 are input into memory 10 at the memory address simultaneously represented by the data present in the appropriate stages of shift register 21. Thus, during the first RPG cycle all memory cells are written to at least once. Since RPG 20 has at least one additional stage compared to the number of memory address lines, RPG 20 does test the address consisting of all zeros. Although the additional stage will cause RPG 20 to cycle through some memory addresses more than once, this loss in efficiency is relatively small compared to the gains (in chip space, test data volume, and operating speed) achieved by avoiding the carry bit logic necessary for addressing when employing deterministic testing During the first RPG cycle, data also passes through shift registers 30, 91, and 92 and into MISR 40. System clock 51 is deactivated to assure that data is not input to shift register 92 during the testing of memory. The outputs of memory 10 must always be in a known, repeatable state, for example all zeros, during all non-read operations.

After initialization is complete, the known data stored in memory circuits 10 is outputted to MISR 40. Data output is accomplished during a second RPG cycle, similar to the first such cycle except that data is now read out of rather than into memory 10. As data recycles through MISR 40, it is modified with each passing through exclusive OR gate 42. Although data has also reached MISR 40 from shift register 92, it too is known data which recycles around MISR 40. Thus, when RPG 20 has completed cycling through all memory addresses, a predictable set of data will remain in shift register 41.

The first two RPG cycles account for one of two data states for each individual memory cell of memory 10. To test for both possible data states at each memory address, the aforementioned testing must be repeated using data which is the complement of that initialized into memory 10 ring the first RPG cycle. Testing is thus repeated using the same test data patterns, but particular memory cells previously initialized to the zero state must now be written with the one state and vice versa. Complementary writing is accomplished during a third RPG cycle which is identical to the first RPG cycle, except that switchable inverter 31 was activated during the second RPG cycle to assure that the complement data is available at the beginning of the third RPG cycle Data which are outputted from RPG 20 to shift register 30 during the third RPG cycle are thus the complement of the data so transferred during the first RPG cycle.

A fourth RPG cycle is required to again output the known data in memory 10 to MISR 40. This RPG cycle is identical to the second RPG cycle except for the differences in the data shifted Since the status of the system is always determinable so long as known seed data are used, the data in shift register 41 are still predictable.

Logic circuits 90 may be functionally tested after memory circuits 10 System clock 51 allows data outputted from RPG 20, through shift register 30, and on to shift register 91 to propagate through logic circuits 90, and be captured in shift register 92. Data outputted from logic circuits 90 to shift register 92 are then inputted to MISR 40. When logic testing is complete, a predictable set of data will be present in the stages of shift register 41.

Checkerboard testing of memory circuits 10 may follow functional testing of memory circuits 10 and logic circuits 90 Initialization may be required prior to the start of checkerboard test. If all the shift registers are in a known state, only shift register 30 must be set to an alternating 1010 . . . pattern (or 0101 . . .). This is accomplished by scanning new data into all the shift registers or through a logical reset of shift register 30 when mode select 56 is activated. With read/write select switch 54 set to write a path is sensitized from exclusive OR gate 63 through AND gate 67, OR gate 66, and AND gate 64 to shift register 30. Shift clock 52 is used to selectively control the output of AND gate 64 and thus the shifting of data through shift registers 30. With each shift of data through the system shift registers, the parity of the current address and next address are compared in exclusive OR gate 63 and used to control the gating of clock pulses to shift register 30. The output of shift register 30 will thus no longer be controlled strictly by random pattern generator 20, but will output a particular logical state depending upon the parity of the current address and the next address. Such control results in the writing of a checkerboard pattern into memory circuits 10 over the course of an RPG 20 cycle, assuming that the logical memory addresses are the equivalent of physical addresses. If not, a translation table may be used to ensure that a checkerboard pattern is actually generated in memory. At the end of the RPG 20 cycle, read/write select switch 54 is used to disable the output from AND gate 67. During the next RPG cycle, the contents of memory circuit 10 are read out into shift register 41 and shift register 30 is shifted once to complement its data. This single pulse is generated by AND gate 65 and passed through OR gate 66 and AND gate 64. The next RPG 20 cycle is used to again write a checkerboard pattern to memory circuits 10, but such checkerboard pattern is the complement of the previously written checkerboard pattern because of the switching of the state of shift register 30 during the previous read cycle. After writing the complementary checkerboard pattern, memory circuits 10 are again read out to shift register 41 during the subsequent RPG 20 cycle.

When checkerboard memory testing is complete, a predictable set of data will be present in the stages of shift register 41. This output signature is then outputted through node 43 and compared to that predicted for properly operating memory circuits 10 using the same seed data. Such signature may be read out instead of or in addition to the signature read out after functional testing. By reading the signatures twice, one is able to determine whether an error detected is related to the interaction between the memory cells.

The aforementioned method of operation is described as generating a single signature in functionally testing both memory circuits 10 or logic circuits 90 or checkerboard testing memory circuits 10. Several variations of this method of operation can also be performed. Checkerboard testing can occur before functional testing, or logic circuits 90 can be tested before memory circuits 10 (and not after), so long as the expected data signature was based similarly and the output of the memory is controlled so as not to corrupt the signature in MISR 40. In addition, data signatures can be outputted for comparison with a known signature at any time during the testing, if so desired. For example, a separate signature comparison can be made for functional testing of memory 10 (after the fourth RPG cycle) for functional testing of logic 90 (after scanning data there through), and for checkerboard testing of memory 10. Similarly, portions of the system (such as logic circuits 90 and shift registers 91 and 92) or testing can be eliminated altogether.

While the invention has been particularly shown and described with reference to a preferred embodiment thereof, it will be understood by those skilled in the art that various changes in form and details may be made therein without departing from the spirit and scope of the invention. For example, FIG. 1 shows only one exclusive OR gate 42 in a single configuration in MISR 40, but the actual number and configuration may be different. Although these features will determine the outputted data signature, such data signature should always be the same for a properly operating circuit tested with the same seed data. RPG 20 may vary similarly.

What is claimed is:

1. A method for a checkerboard self-test of memory circuits having a random pattern generator connected to address lines and data input lines thereof, the random pattern generator including means for stepping through each memory address, including a current memory address and a next memory address having a parity, during a random pattern generator cycle, the address lines including a least significant address line and a next least significant address line each having a binary state, the memory circuits having a multiple input signature register connected to output lines thereof, comprising the steps of:

providing the random pattern generator with known seed data;

continuously monitoring the parity of the current memory address and the next memory address to appear in the random pattern generator by using the binary state of the least significant and the next least significant address lines of the random pattern generator;

writing checkerboard data into the memory circuits during a first random pattern generator cycle;

outputting the checkerboard data from the memory circuits to the multiple input signature register during a second random pattern generator cycle;

writing checkerboard data into the memory circuits during a third random pattern generator cycle, the data written during the third random pattern generator cycle being a complement of the data written during the first random pattern generator cycle;

outputting the checkerboard data from the memory circuits to the multiple input signature register during a fourth random pattern generator cycle, thereby generating a data signature in the multiple input signature register; and comparing the data signature in the multiple input signature register with that which would be generated by the memory circuits if such are operating properly and provided with the same seed data.

2. The method of claim 1 wherein said step of continuously monitoring the parity of the current memory address and the next memory address includes comparing the binary state of the least significant address line with the binary state of the next least significant address line.

3. The method of claim 1 wherein said steps of writing checkerboard data into the memory circuits during the first and third random pattern generator cycles includes writing a first binary state at each memory address determined to be of the first binary state during the step of continuously monitoring the parity of the current memory address and the next memory address, and writing a second binary state at each memory address determined to be of the second binary state during the step of continuously monitoring the parity of the current memory address and the next memory address.

4. The method of claim 3 wherein said step of continuously monitoring the parity of the current memory and the next memory address includes comparing the binary state of the least significant address line with the binary state of the next least significant address line.

5. A method for a self-test of memory circuits having a random pattern generator connected to address lines and data input lines thereof, the random pattern generator including means for stepping through each memory address, including a current memory address and a next memory address having a parity, during a random pattern generator cycle, the address lines including a least significant address line and a next least significant address line each having a binary state, the memory circuits having a multiple input signature register connected to output lines thereof, comprising the steps of:

providing the random pattern generator with known seed data;

writing random data into the memory circuits during a first random pattern generator cycle;

outputting data from the memory circuits to the multiple input signature register during a second random pattern generator cycle;

writing random data into the memory circuits during a third random pattern generator cycle, the data written during the third random pattern generator cycle being a complement of the data written during the first random pattern generator cycle;

outputting the random data from the memory circuits to the multiple input signature register during a fourth random pattern generator cycle;

writing checkerboard data into the memory circuits during a fifth random pattern generator cycle;

outputting the checkerboard data from the memory circuits to the multiple input signature register during a sixth random pattern generator cycle;

writing checkerboard data into the memory circuits during a seventh random pattern generator cycle, the data written during the seventh random pattern generator cycle being a complement of the data written during the fifth random pattern generator cycle;

outputting the checkerboard data from the memory circuits to the multiple input signature register during an eighth random pattern generator cycle, thereby generating a data signature in the multiple input signature register;

continuously monitoring the parity of the current memory address and the next memory address to appear in the random pattern generator during the fifth and seventh random pattern generator cycles by using the binary state of the least significant and the next least significant address lines of the random pattern generator; and comparing the data signature in the multiple input signature register with that which would be generated by the memory circuits if such are operating properly and provided with the same seed data.

6. A system for checkerboard memory self-test comprising:

a memory array having address lines, input lines, and output lines, the address lines including a least significant address line and a next least significant address line each having a binary state;

a multiple input signature register connected to the output lines of the memory array;

a random pattern generator connected to the address lines and input lines of the memory array, the random pattern generator capable of stepping through each memory address, including a current memory address and a next memory address having a parity; and means connected to the address lines and the input lines of the memory array for monitoring the parity of the current memory address and the next memory address to appear in the random pattern generator.

7. The system of claim 6 wherein said means comprises an exclusive OR gate connected between the address lines and the input lines, the least significant and the next least significant address lines connected to the input of the exclusive OR gate.

8. The system of claim 7 wherein said means further comprises: AND, OR, and AND gates sequentially connected between the exclusive OR gate and the input lines.

9. A system for functional and checkerboard memory self-test comprising:

a memory array having address lines, input lines, and output lines;

a multiple input signature register connected to the output lines of the memory array;

a random pattern generator based upon a primitive polynomial and connected to the address lines and input lines of the memory array, the random pattern generator capable of stepping through each memory address, including a current memory address and a next memory address having a parity, the random pattern generator having at least one stage in addition to the number of address lines; and means connected to the address lines and the input lines of the memory array for monitoring the parity of the current memory address and the next memory address to appear in the random pattern generator.

* * * * *

UNITED STATES PATENT AND TRADEMARK OFFICE
CERTIFICATE OF CORRECTION

PATENT NO. : 5,101,409

DATED : March 31, 1992

INVENTOR(S) : George E. Hack

It is certified that error appears in the above-identified patent and that said Letters Patent is hereby corrected as shown below:

Title [54] change "CHECKBOARD" to --CHECKERBOARD--.

Column 1, line 1, change "CHECKBOARD" to --CHECKERBOARD--.

Column 1, line 30, change (2nd occur.) to read --testing--.

Column 1, line 62, change "ISSD" to --LSSD--.

Column 5, line 30, change "On" to --$O_n$.--

Column 5, line 33, change "(2mxn)" to --($2^m$ x n)--.

Column 5, line 38, change "$5A_1-5A_{m+1}$" to --$SA_1-SA_{m+1}$--.

Column 6, line 17, insert --.-- after "generated".

Column 6, line 31, change "$SI_1-Si_n$" to --$SI_1-SI_n$--.

Column 6, line 34, change "47" to --97--.

Column 6, line 43, change "$50_1-50_{n+1}$" to --$SO_1-SO_{n+1}$--.

Column 7, line 38, change "addition" to --additional--.

Column 7, line 39, change "lines" to --line--.

Column 8, line 2, change "blocks" to --clocks--.

Column 8, line 21, change "2(m+1)-1" to --$2^{(m\pm1)}-1$--.

Column 8, line 38, after "testing" insert --.--.

Column 8, line 62, change "ring" to --during--.

Column 9, line 9, after "shifted" insert --.--.

Column 9, line 14, after "10" insert --.--.

UNITED STATES PATENT AND TRADEMARK OFFICE
CERTIFICATE OF CORRECTION

PATENT NO. : 5,101,409
DATED : March 31, 1992
INVENTOR(S) : George E. Hack

It is certified that error appears in the above-indentified patent and that said Letters Patent is hereby corrected as shown below:

Column 9, line 24, after "90" insert --.--.

Signed and Sealed this

Eighteenth Day of April, 1995

*Attest:*

BRUCE LEHMAN

*Commissioner of Patents and Trademarks*

*Attesting Officer*

UNITED STATES PATENT AND TRADEMARK OFFICE
CERTIFICATE OF CORRECTION

PATENT NO. : 5,101,409
DATED : March 31, 1992
INVENTOR(S) : George E. Hack

It is certified that error appears in the above-indentified patent and that said Letters Patent is hereby corrected as shown below:

Title [54] change "CHECKBOARD" to --CHECKERBOARD--.
Column 1, line 1, change "CHECKBOARD" to --CHECKERBOARD--.
Column 1, line 30, change "resting to --testing--.
Column 1, line 62, change "ISSD" to --LSSD--.
Column 5, line 30, change "On" to -- $O_n$.--
Column 5, line 33, change "(2mxn)" to --($2^m \times n$)--.
Column 5, line 38, change "$5A_1-5A_{m+1}$" to --$SA_1-SA_{m+1}$--.
Column 6, line 17, insert --.-- after "generated".
Column 6, line 31, change "$SI_1-Si_n$" to --$SI_1-SI_n$--.
Column 6, line 34, change "47" to --97--.
Column 6, line 43, change "$50_1-50_{n+1}$" to --$SO_1-SO_{n+1}$--.
Column 7, line 38, change "addition" to --additional--.
Column 7, line 39, change "lines" to --line--.
Column 8, line 2, change "blocks" to --clocks--.
Column 8, line 21, change "2(m+1)-1" to --$2^{(M+1)}-1$--.
Column 8, line 38, after "testing" insert --.--.
Column 8, line 62, change "ring" to --during--.

UNITED STATES PATENT AND TRADEMARK OFFICE
CERTIFICATE OF CORRECTION

PATENT NO. : 5,101,409
DATED : March 31, 1992
INVENTOR(S) : George E. Hack

It is certified that error appears in the above-indentified patent and that said Letters Patent is hereby corrected as shown below:

Column 9, line 9, after "shifted" insert --.--.
Column 9, line 14, after "10" insert --.--.
Column 9, line 24, after "90" insert --.--.

This certificate supersedes Certificate of Correction issued April 18, 1995.

Signed and Sealed this

Twelfth Day of September, 1995

Attest:

BRUCE LEHMAN

Attesting Officer      Commissioner of Patents and Trademarks